United States Patent
Saji

(10) Patent No.: US 11,476,830 B2
(45) Date of Patent: Oct. 18, 2022

(54) ELASTIC WAVE DEVICE

(71) Applicant: Murata Manufacturing Co., Ltd., Nagaokakyo (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 822 days.

(21) Appl. No.: 16/278,839

(22) Filed: Feb. 19, 2019

(65) Prior Publication Data
US 2019/0288664 A1    Sep. 19, 2019

(30) Foreign Application Priority Data

Mar. 19, 2018 (JP) .............. JP2018-050602

(51) Int. Cl.
| | |
|---|---|
| H03H 9/02 | (2006.01) |
| H01L 41/047 | (2006.01) |
| H03H 9/145 | (2006.01) |
| H03H 9/25 | (2006.01) |

(52) U.S. Cl.
CPC .... *H03H 9/02866* (2013.01); *H03H 9/02559* (2013.01); *H03H 9/02834* (2013.01); *H03H 9/14541* (2013.01); *H03H 9/25* (2013.01); *H01L 41/0477* (2013.01)

(58) Field of Classification Search
CPC ........... H03H 9/02866; H03H 9/02559; H03H 9/02834; H03H 9/14541; H03H 9/25; H01L 41/0477
USPC ...... 310/313 R, 313 A, 313 B, 313 C, 313 D
See application file for complete search history.

(56) References Cited

U.S. PATENT DOCUMENTS 7,772,742 B2 * 8/2010 Kando ............... H03H 9/02834
                                                  310/346
2008/0303379 A1   12/2008 Nakai et al.
2014/0167881 A1   6/2014 Iwasaki et al.

FOREIGN PATENT DOCUMENTS

| CN | 104641555 A | 5/2015 |
|---|---|---|
| WO | 2007/097186 A1 | 8/2007 |

OTHER PUBLICATIONS

Official Communication issued in corresponding Chinese Patent Application No. 201910207419.7, dated Aug. 29, 2022.

* cited by examiner

*Primary Examiner* — Derek J Rosenau
(74) *Attorney, Agent, or Firm* — Keating & Bennett, LLP

(57) ABSTRACT

In an elastic wave device, an IDT electrode is provided on a piezoelectric substrate and a first silicon oxide film covers the IDT electrode. A high-acoustic-velocity dielectric film covers the first silicon oxide film. A second silicon oxide film is provided on the high-acoustic-velocity dielectric film. The piezoelectric substrate is made of lithium niobate. The high-acoustic-velocity dielectric film propagates longitudinal waves at an acoustic velocity higher than an acoustic velocity of longitudinal waves propagating through the first silicon oxide film. The high-acoustic-velocity dielectric film is provided at a distance of about (t1+t2)×0.42 or less from a first main surface of the piezoelectric substrate in a thickness direction of the piezoelectric substrate.

14 Claims, 7 Drawing Sheets

US 11,476,830 B2

ELASTIC WAVE DEVICE

CROSS REFERENCE TO RELATED APPLICATIONS

This application claims the benefit of priority to Japanese Patent Application No. 2018-050602 filed on Mar. 19, 2018. The entire contents of this application are hereby incorporated herein by reference.

BACKGROUND OF THE INVENTION

1. Field of the Invention

The present invention relates to an elastic wave device, more specifically, to an elastic wave device including a piezoelectric substrate and a silicon oxide film.

2. Description of the Related Art

There are known elastic wave devices (surface acoustic wave devices) using Rayleigh waves as the main mode (for example, refer to WO 2007/097186).

WO 2007/097186 discloses an elastic wave device including a $LiNbO_3$ substrate, an electrode at least including an IDT electrode, a first silicon oxide film, and a second silicon oxide film. The electrode is formed on the $LiNbO_3$ substrate. The first silicon oxide film is formed in the remaining region except for the electrode region so as to have the same thickness as the electrode. The second silicon oxide film covers the electrode and the first silicon oxide film.

The elastic wave device of WO 2007/097186 causes generation of Sezawa waves, which are spurious waves for Rayleigh waves, on the high-frequency side of the anti-resonant frequency of Rayleigh waves.

SUMMARY OF THE INVENTION

Preferred embodiments of the present invention provide elastic wave devices that each achieve a decrease in intensity of Sezawa waves, which are spurious waves for Rayleigh waves, while reducing or preventing degradation of the electric power handling capability of an IDT electrode.

An elastic wave device according to a preferred embodiment of the present invention uses Rayleigh waves as the main mode. The elastic wave device includes a piezoelectric substrate, an IDT electrode, a first silicon oxide film, a high-acoustic-velocity dielectric film, and a second silicon oxide film. The piezoelectric substrate includes a main surface. The IDT electrode is provided on the main surface of the piezoelectric substrate. The first silicon oxide film is provided on the piezoelectric substrate so as to cover the IDT electrode. The high-acoustic-velocity dielectric film is provided on the first silicon oxide film or the piezoelectric substrate so as to cover the first silicon oxide film. The high-acoustic-velocity dielectric film propagates longitudinal waves at an acoustic velocity higher than the acoustic velocity of longitudinal waves propagating through the first silicon oxide film. The second silicon oxide film is made on the high-acoustic-velocity dielectric film. The piezoelectric substrate is made of lithium niobate. The high-acoustic-velocity dielectric film is separated from the IDT electrode. The high-acoustic-velocity dielectric film is disposed at a distance of about $(t1+t2) \times 0.42$ or less from the main surface of the piezoelectric substrate in the thickness direction of the piezoelectric substrate, where $t1$ represents the thickness of the first silicon oxide film, and $t2$ represents the thickness of the second silicon oxide film.

An elastic wave device according to a preferred embodiment of the present invention uses Rayleigh waves as a main mode. The elastic wave device includes a piezoelectric substrate, an IDT electrode, a first silicon oxide film, a high-acoustic-velocity dielectric film, and a second silicon oxide film. The piezoelectric substrate includes a main surface. The IDT electrode is provided on the main surface of the piezoelectric substrate. The first silicon oxide film is provided on the piezoelectric substrate so as to cover the IDT electrode. The high-acoustic-velocity dielectric film is provided on the first silicon oxide film or the piezoelectric substrate so as to cover the first silicon oxide film. The second silicon oxide film is provided on the high-acoustic-velocity dielectric film. The piezoelectric substrate is made of lithium niobate. The high-acoustic-velocity dielectric film is separated from the IDT electrode. The high-acoustic-velocity dielectric film is disposed at a distance of about $(t1+t2) \times 0.42$ or less from the main surface of the piezoelectric substrate in the thickness direction of the piezoelectric substrate, where $t1$ represents the thickness of the first silicon oxide film, and $t2$ represents the thickness of the second silicon oxide film. The high-acoustic-velocity dielectric film includes at least one material selected from silicon nitride, aluminum nitride, aluminum oxide, silicon carbide, and diamond-like carbon.

Preferred embodiments of the present invention each achieve a decrease in the intensity of Sezawa waves, which are spurious waves for Rayleigh waves, while reducing or preventing degradation of an electric power handling capability of an IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
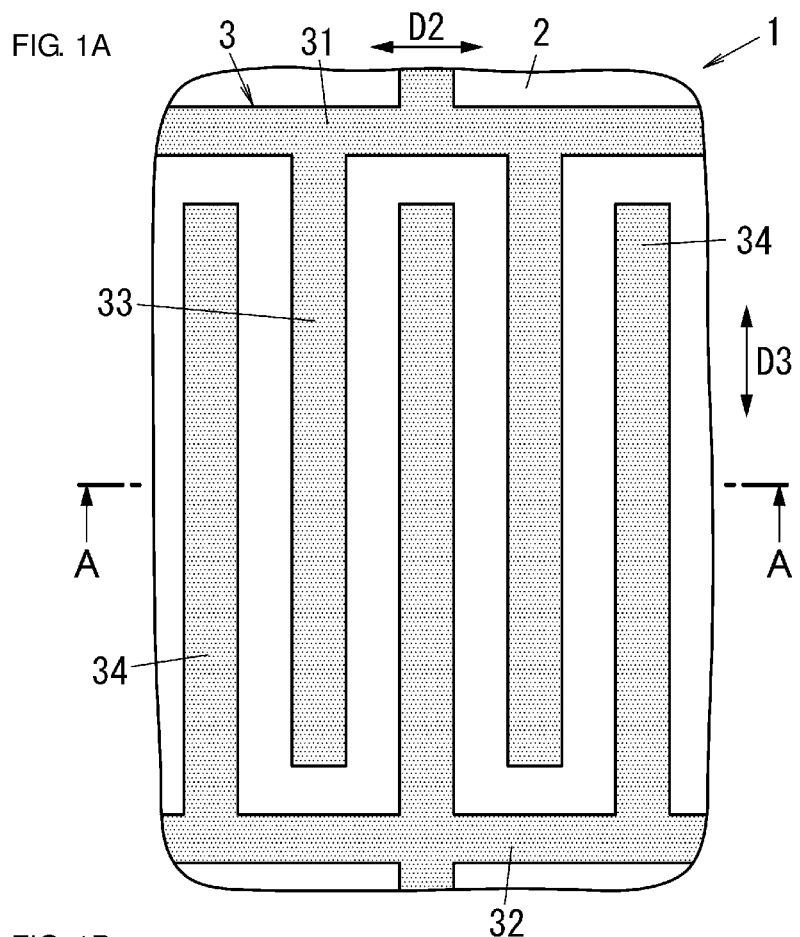
FIG. 1A is a plan view of an elastic wave device according to a preferred embodiment of the present invention.

Hereinafter, elastic wave devices according to preferred embodiments of the present invention will be described with reference to drawings.

FIG. 1A, FIG. 1B, FIG. 2, FIG. 8, and FIG. 9, which will be referred to in the following preferred embodiments and modifications thereof, are all schematic views, and the elements in the drawings are not necessarily drawn to scale in terms of dimensional or thickness ratios.

Figure 1B:
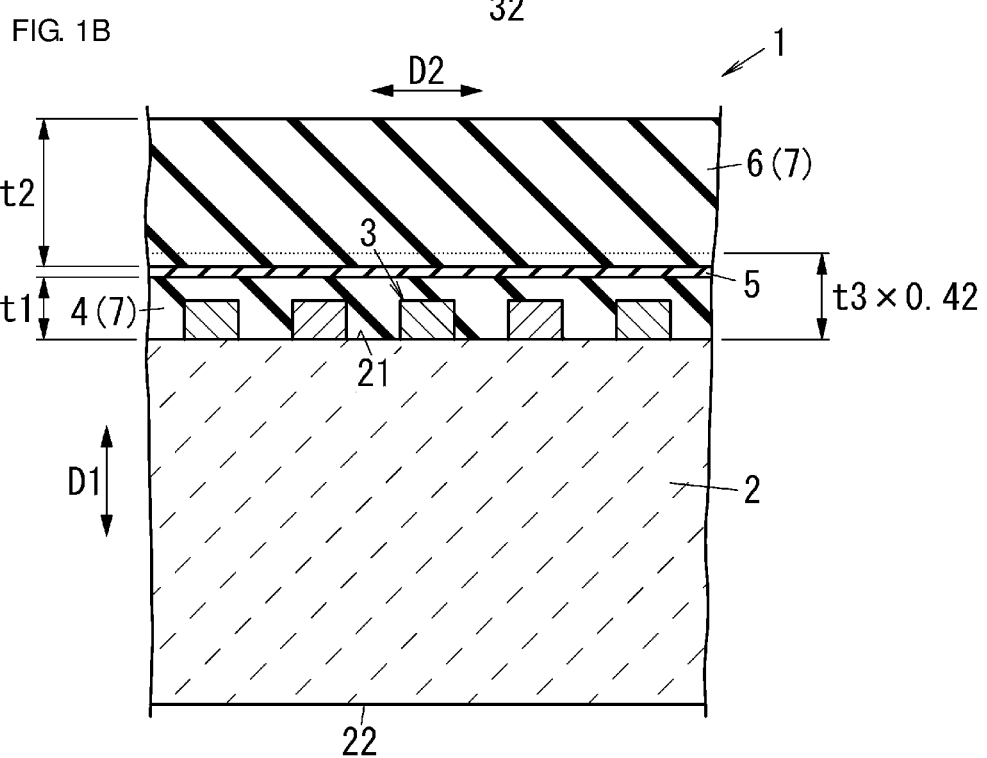
FIG. 1B is a sectional view taken along line A-A in FIG. 1A.

An elastic wave device 1 according to a preferred embodiment is preferably, for example, a surface acoustic wave (SAW) resonator using Rayleigh waves as the main mode. As illustrated in FIGS. 1A and 1B, the elastic wave device 1 includes a piezoelectric substrate 2, an IDT (interdigital transducer) electrode 3, a first silicon oxide film 4, a high-acoustic-velocity dielectric film 5, and a second silicon oxide film 6. In FIG. 1A, the IDT electrode 3 is hatched with dots. However, this hatching is provided not to indicate a section, but to facilitate understanding of the relationship between the IDT electrode 3 and the piezoelectric substrate 2. In FIG. 1A, the first silicon oxide film 4, the high-acoustic-velocity dielectric film 5, and the second silicon oxide film 6 are not illustrated.

The piezoelectric substrate 2 is preferably made of, for example, lithium niobate ($LiNbO_3$). The piezoelectric substrate 2 includes a first main surface (main surface) 21. The IDT electrode 3 is provided on the first main surface 21 of the piezoelectric substrate 2. The "first main surface (main surface)" is a surface having the largest area in the piezoelectric substrate 2.

The first silicon oxide film 4 is provided on the piezoelectric substrate 2 so as to cover the IDT electrode 3. As illustrated in FIG. 1B, the high-acoustic-velocity dielectric film 5 is provided on the first silicon oxide film 4 so as to cover the first silicon oxide film 4. The second silicon oxide film 6 is provided on the high-acoustic-velocity dielectric film 5. As illustrated in FIG. 1B, the high-acoustic-velocity dielectric film 5 is separated from the IDT electrode 3 with the first silicon oxide film 4 therebetween, so that the high-acoustic-velocity dielectric film 5 is not in contact with the IDT electrode 3.

The piezoelectric substrate 2 is preferably, for example, a Γ° Y-cut X-propagation lithium niobate ($LiNbO_3$) single crystal. The Γ° Y-cut X-propagation lithium niobate single crystal is a single crystal that is provided by cutting a lithium niobate single crystal (having three crystalline axes defined as X-axis, Y-axis, and Z-axis) along a plane defined with its normal line being an axis obtained by rotating, relative to X-axis, Y-axis in the Z-axis direction by Γ°, and that propagates surface acoustic waves in the X-axis direction. Γ° is preferably, for example, about 38°. The cut angle of the piezoelectric substrate 2 is defined as cut angle Γ=θ+90 where the piezoelectric substrate 2 has Euler angles (φ, θ, ψ). Incidentally, Γ and Γ±180×n have the same meaning (crystallographically equivalent).

The cut angle Γ of the piezoelectric substrate 2 is not limited to about 38°, and may preferably be a value of about 36° to about 40°, for example. The piezoelectric substrate 2 includes the first main surface 21 and a second main surface 22, which oppose each other (disposed on opposite sides) in a first direction D1 extending in the thickness direction (hereafter, also referred to as "the thickness direction D1").

The IDT electrode 3 may be appropriately made of a metal material, for example, such as Al, Cu, Pt, Au, Ag, Ti, Ni, Cr, Mo, W, or an alloy mainly including any one of the foregoing metals. The IDT electrode 3 may have a laminated structure including a plurality of metal films made of such metals or alloys. For example, the IDT electrode 3 preferably has a laminated structure including a platinum (Pt) layer and an aluminum (Al) layer. When the wavelength of elastic waves, which depends on the electrode finger period of the IDT electrode 3, is defined as λ, preferably, the platinum layer has a thickness of, for example, about 0.02λ, and the aluminum layer has a thickness of, for example, about 0.03λ.

The IDT electrode 3 is provided on the piezoelectric substrate 2. Specifically, the IDT electrode 3 is provided on the first main surface 21 of the piezoelectric substrate 2. As illustrated in FIG. 1A, the IDT electrode 3 includes a first busbar 31, a second busbar 32, a plurality of (two in the illustrated example) first electrode fingers 33, and a plurality of (three in the illustrated example) second electrode fingers 34.

The first busbar 31 and the second busbar 32 are elongated members extending in a second direction D2, which is orthogonal or substantially orthogonal to the thickness direction (first direction) D1 of the piezoelectric substrate 2. In the IDT electrode 3, the first busbar 31 and the second busbar 32 face each other in a third direction D3, which is orthogonal or substantially orthogonal to both of the first direction D1 and the second direction D2. In other words, the second busbar 32 faces the first busbar 31 in the third direction D3.

The plurality of first electrode fingers 33 are connected to the first busbar 31 and extend toward the second busbar 32. In other words, the plurality of first electrode fingers 33 extend from the first busbar 31 in the third direction D3. The tips of the plurality of first electrode fingers 33 are separated from the second busbar 32. The plurality of first electrode fingers 33 may preferably have approximately the same length and approximately the same width, for example.

The plurality of second electrode fingers 34 are connected to the second busbar 32, and extend toward the first busbar 31. In other words, the plurality of second electrode fingers 34 extend from the second busbar 32 in the third direction D3. The tips of the plurality of second electrode fingers 34 are separated from the first busbar 31. The plurality of second electrode fingers 34 may preferably have approximately the same length and approximately the same width, for example. In FIG. 1A, the plurality of second electrode fingers 34 and the plurality of first electrode fingers 33 preferably have approximately the same length and approximately the same width, for example.

In the IDT electrode 3, the plurality of first electrode fingers 33 and the plurality of second electrode fingers 34 are alternately arranged adjacent to and spaced apart from one another in the second direction D2. Thus, a first electrode finger 33 and a second electrode finger 34 that are adjacent to each other in the longitudinal direction (second direction D2) of the first busbar 31 are spaced apart from each other.

An electrode-finger group including the plurality of first electrode fingers 33 and the plurality of second electrode fingers 34 is structured such that the plurality of first electrode fingers 33 and the plurality of second electrode fingers 34 are at least spaced apart from one another in the second direction D2, but the plurality of first electrode fingers 33 and the plurality of second electrode fingers 34 may not be alternately arranged adjacent to and spaced apart from one another in the second direction D2. For example, the electrode-finger group may include a region in which the first electrode fingers 33 and the second electrode fingers 34 are alternately arranged adjacent to and spaced apart from one another as well as another region in which two first electrode fingers 33 or two second electrode fingers 34 are arranged adjacent to each other in the second direction D2. In the IDT electrode 3, the number of the plurality of first electrode fingers 33 and the number of the plurality of second electrode fingers 34 are not particularly limited.

The first silicon oxide film 4 and the second silicon oxide film 6 are preferably dielectric films including silicon dioxide ($SiO_2$), for example. As illustrated in FIG. 1B, the first silicon oxide film 4 is provided on the piezoelectric substrate 2 so as to cover the IDT electrode 3. Specifically, the first silicon oxide film 4 is provided on the first main surface 21 of the piezoelectric substrate 2 so as to cover the IDT electrode 3. The phrase "cover the IDT electrode 3" means that the first silicon oxide film 4 covers the entirety or substantially the entirety of the IDT electrode 3 such that other films do not come into contact with the IDT electrode 3. The second silicon oxide film 6 is provided on the high-acoustic-velocity dielectric film 5. The first silicon oxide film 4 preferably has a thickness t1 of, for example, about 0.06λ. The second silicon oxide film 6 preferably has a thickness t2 of, for example, about 0.29λ. Thus, the entire silicon oxide film (hereafter, also referred to as the "silicon oxide film 7") including the first silicon oxide film 4 and the second silicon oxide film 6 preferably has a thickness t3 of about 0.35λ.

Lithium niobate, from which the piezoelectric substrate 2 is made, has a large coefficient of linear expansion. In the elastic wave device 1 according to the present preferred embodiment, the silicon oxide film 7 (the first silicon oxide film 4 and the second silicon oxide film 6) having a coefficient of linear expansion contrastive to that of lithium niobate is provided on the piezoelectric substrate 2, to thus provide improved frequency temperature characteristics. In this case, the larger the thickness of the silicon oxide film 7, the better the frequency temperature characteristics, but the higher the intensity of Sezawa waves, which are spurious waves for Rayleigh waves. In other words, the relationship between the frequency temperature characteristics and the intensity of Sezawa waves is a tradeoff relationship.

The high-acoustic-velocity dielectric film 5 is preferably, for example, a dielectric film including silicon nitride. As illustrated in FIG. 1B, the high-acoustic-velocity dielectric film 5 is provided on the first silicon oxide film 4 so as to cover the first silicon oxide film 4. Specifically, the high-acoustic-velocity dielectric film 5 is provided along the first main surface of the first silicon oxide film 4, the first main surface being opposite to the second main surface, which is closer to the piezoelectric substrate 2. The high-acoustic-velocity dielectric film 5 preferably has a thickness of, for example, about 0.03λ. The high-acoustic-velocity dielectric film 5 propagates longitudinal waves at an acoustic velocity higher than that of longitudinal waves propagating through the first silicon oxide film 4.

As illustrated in FIG. 1B, the high-acoustic-velocity dielectric film 5 is preferably disposed between the first main surface 21 of the piezoelectric substrate 2 and a position of a distance of, for example, about t3×0.42 from the first main surface 21. In other words, the high-acoustic-velocity dielectric film 5 is preferably disposed at, for example, a position of a distance of about t3×0.42 or less from the first main surface 21 in the thickness direction (first direction) D1 of the piezoelectric substrate 2, where t3 represents the thickness of the silicon oxide film 7, and is the sum of the thickness t1 of the first silicon oxide film 4 and the thickness t2 of the second silicon oxide film 6. Such a configuration provides improved frequency temperature characteristics and achieves a decrease in the intensity of Sezawa waves.

Figure 2:
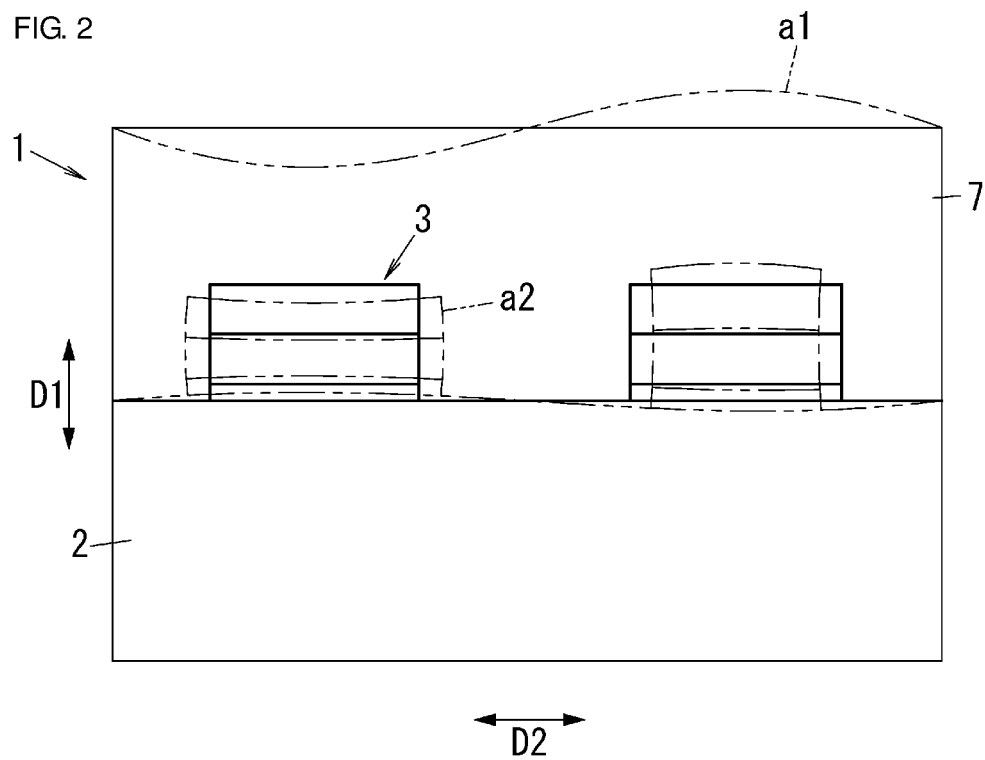
FIG. 2 illustrates displacement of Sezawa waves in the elastic wave device.
Figure 3:
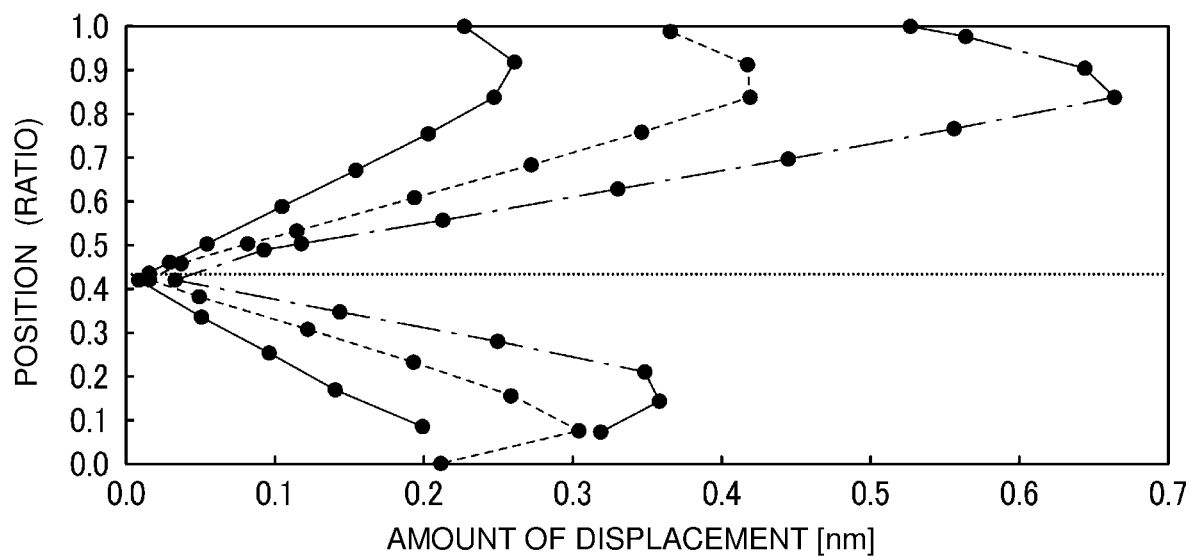
FIG. 3 is a graph illustrating, in the elastic wave device, the relationship between a position in the thickness direction and the amount of displacement of Sezawa waves.

FIG. 2 illustrates simulation results of the displacement distribution due to Sezawa waves in the elastic wave device 1 according to the present preferred embodiment. In FIG. 2, the solid lines represent a state of elements displaced without excitation of Sezawa waves. In FIG. 2, the double-dot-dashed lines represent a momentary state of elements displaced under excitation of Sezawa waves. FIG. 3 is a graph illustrating the relationship between the position (in the thickness direction (first direction D1)) in the elastic wave device 1 according to the present preferred embodiment and the amount of displacement due to Sezawa waves. In FIG.

3, a position at 0.0 corresponds to the position of the first main surface 21 of the piezoelectric substrate 2; and another position at 1.0 corresponds to the position of a surface of the second silicon oxide film 6, the surface being opposite to the piezoelectric substrate 2. In FIG. 3, the solid line represents a case of the silicon oxide film 7 having a thickness t3 of about 0.30λ, the broken line represents a case of the thickness t3 being about 0.33λ, and the single-dot-dashed line represents a case of the thickness t3 being about 0.36λ.

FIG. 2 demonstrates the following. As represented by a double-dot-dashed line a1, in a region at and near the above-described surface of the second silicon oxide film 6, Sezawa waves vibrate in the first direction D1, which is the thickness direction of the piezoelectric substrate 2. On the other hand, in another region at and near the IDT electrode 3 provided on the first main surface 21 of the piezoelectric substrate 2, as represented by double-dot-dashed lines a2, Sezawa waves vibrate in the propagation direction of elastic waves, which is the second direction D2.

FIG. 3 demonstrates that, in any of the cases in which the silicon oxide film 7 has a thickness t3 of about 0.30λ, about 0.33λ, or about 0.36λ, the amount of displacement due to Sezawa waves is substantially 0 nm at a position of a distance of about t3×0.42 from the first main surface 21 of the piezoelectric substrate 2. In other words, the direction of displacement is inferentially changed at a position at a distance of the thickness of the silicon oxide film 7 about t3×0.42 from the first main surface 21 of the piezoelectric substrate 2.

From FIG. 2 and FIG. 3, Sezawa waves inferentially vibrate in the elastic-wave propagation direction (second direction D2) in a region extending to the piezoelectric substrate 2 from a position at a distance of a thickness of the silicon oxide film 7 of about t3×0.42 from the first main surface 21 of the piezoelectric substrate 2. In other words, Sezawa waves inferentially vibrate as longitudinal waves in the region extending, to the piezoelectric substrate 2, from the position of the distance of the thickness of the silicon oxide film 7 of about t3×0.42 from the first main surface 21 of the piezoelectric substrate 2.

In general, longitudinal waves propagate at a high acoustic velocity in media that propagate longitudinal waves at a high acoustic velocity. Thus, such a medium propagating longitudinal waves at a high acoustic velocity may be disposed in the region at which longitudinal waves vibrate, to thus increase the acoustic velocity of Sezawa waves propagating through the region. As illustrated in FIG. 1B, the elastic wave device 1 according to the present preferred embodiment includes the high-acoustic-velocity dielectric film 5 disposed in the region extending, to the piezoelectric substrate 2, from the position of the distance of the thickness of the silicon oxide film 7 of about t3 (=t1+t2)×0.42 from the first main surface 21 of the piezoelectric substrate 2. This enables an increase in the acoustic velocity of Sezawa waves, compared with another structure not including the high-acoustic-velocity dielectric film 5.

Another structure may be used in which, in the elastic wave device 1 in FIG. 1B, the first silicon oxide film 4 is omitted. In this case, the IDT electrode 3 is covered by the high-acoustic-velocity dielectric film 5. Thus, the high-acoustic-velocity dielectric film 5 is in contact with the IDT electrode 3. In this structure, the high-acoustic-velocity dielectric film 5 is in contact with the first electrode fingers 33 and the second electrode fingers 34 of the IDT electrode 3. This structure enables an increase in the acoustic velocity of Sezawa waves, but causes degradation of the electric power handling capability of the first electrode fingers 33 and the second electrode fingers 34. For this reason, the IDT electrode 3 is preferably covered by the first silicon oxide film 4, so that the high-acoustic-velocity dielectric film 5 is not in contact with the IDT electrode 3. In other words, the high-acoustic-velocity dielectric film 5 is preferably physically separated from the IDT electrode 3 with the first silicon oxide film 4 therebetween, so that the high-acoustic-velocity dielectric film 5 is not in contact with the IDT electrode 3.

Figure 4:
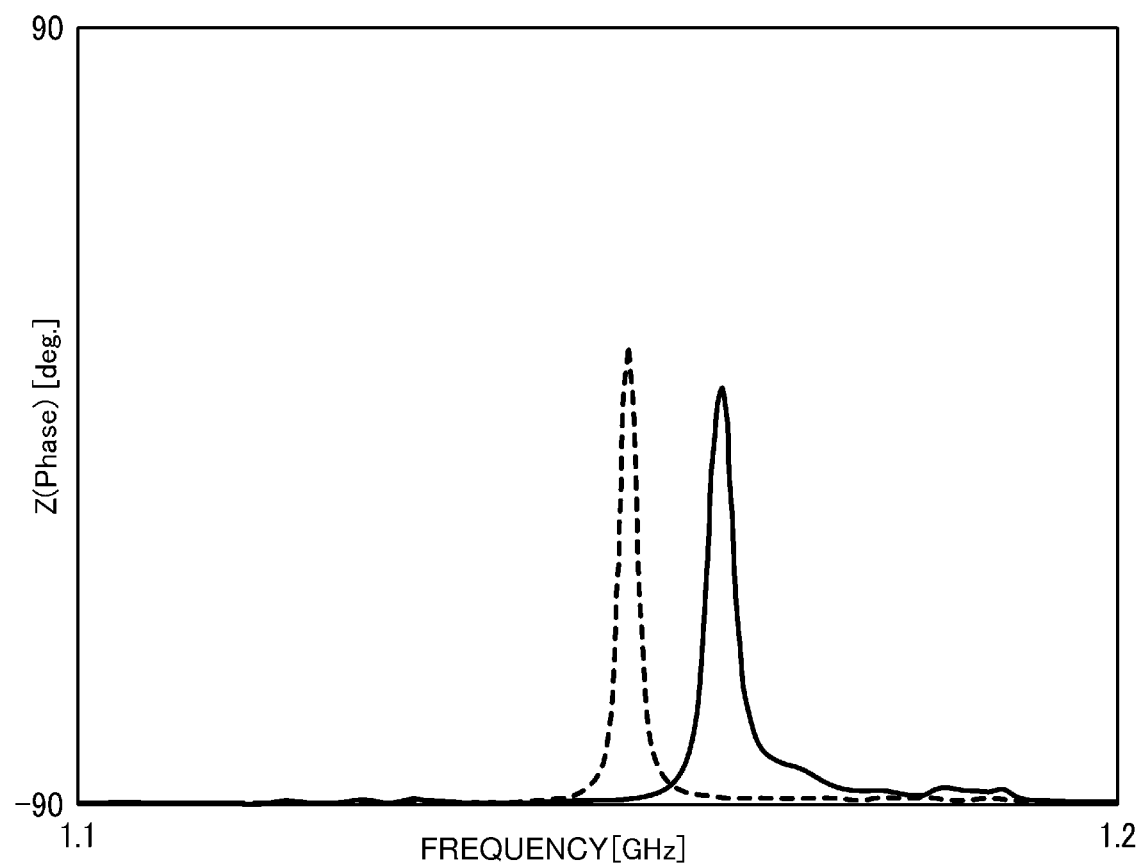
FIG. 4 is a graph of impedance-frequency characteristics of the elastic wave device shown in FIGS. 1A and 1B.

FIG. 4 is a graph of impedance-frequency characteristics of Sezawa waves in the elastic wave device 1 according to the present preferred embodiment. In FIG. 4, the broken line represents impedance-frequency characteristics of a structure not including the high-acoustic-velocity dielectric film 5, and the solid line represents impedance-frequency characteristics of a structure including the high-acoustic-velocity dielectric film 5.

FIG. 4 demonstrates that, compared with the structure not including the high-acoustic-velocity dielectric film 5, the structure including the high-acoustic-velocity dielectric film 5 enables an increase in the acoustic velocity of Sezawa waves, to thus achieve a decrease in the intensity of Sezawa waves. In other words, the elastic wave device 1 according to the present preferred embodiment achieves a decrease in the intensity of Sezawa waves, which are spurious waves for Rayleigh waves, while reducing or preventing degradation of the electric power handling capability of the IDT electrode 3.

Figure 5A:
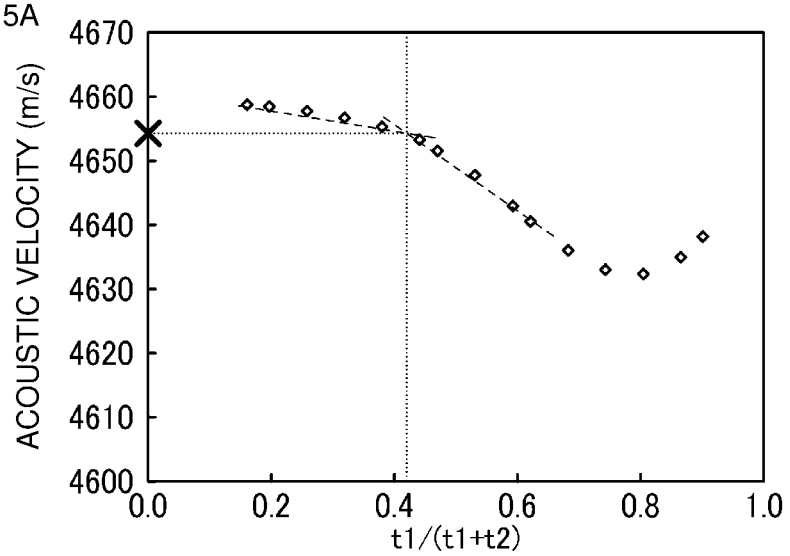
FIG. 5A is a graph illustrating, in the elastic wave device in which the total thickness of the entire silicon oxide film and a high-acoustic-velocity dielectric film is about 0.33λ, and a piezoelectric substrate has Euler angles of (about 0°, about 36°, about 0°), the relationship between the acoustic velocity of Sezawa waves and the thickness ratio of a first silicon oxide film to the entire silicon oxide film.
Figure 5B:
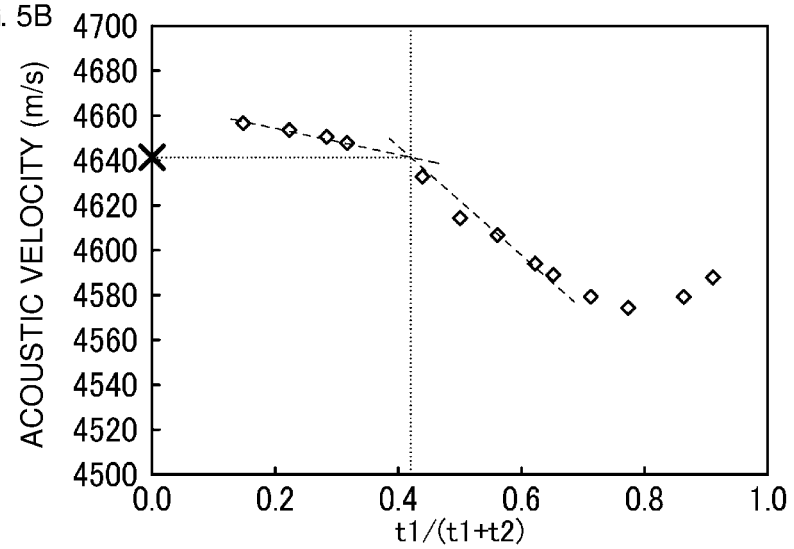
FIG. 5B is a graph illustrating, in the elastic wave device in which the total thickness of the entire silicon oxide film and a high-acoustic-velocity dielectric film is about 0.36λ, and a piezoelectric substrate has Euler angles of (about 0°, about 36°, about 0°), the relationship between the acoustic velocity of Sezawa waves and the thickness ratio of a first silicon oxide film to the entire silicon oxide film.
Figure 5C:
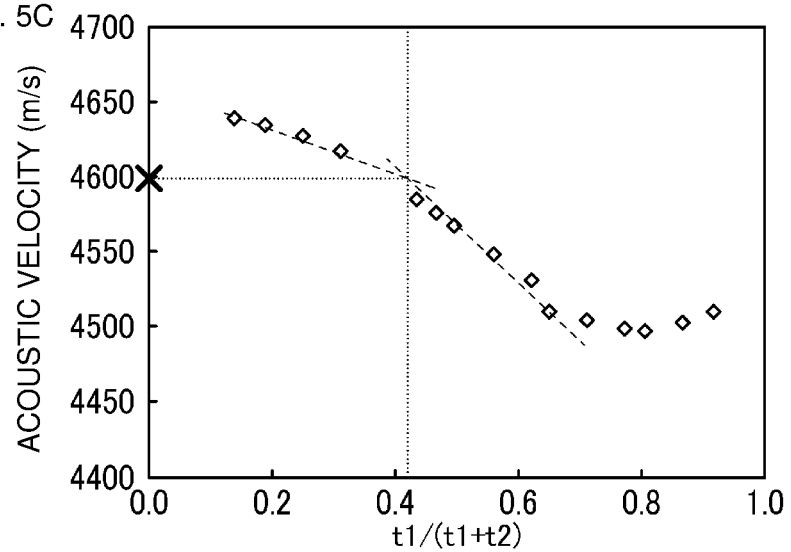
FIG. 5C is a graph illustrating, in the elastic wave device in which the total thickness of the entire silicon oxide film and a high-acoustic-velocity dielectric film is about 0.39λ, and a piezoelectric substrate has Euler angles of (about 0°, about 36°, about 0°), the relationship between the acoustic velocity of Sezawa waves and the thickness ratio of a first silicon oxide film to the entire silicon oxide film.
Figure 6A:
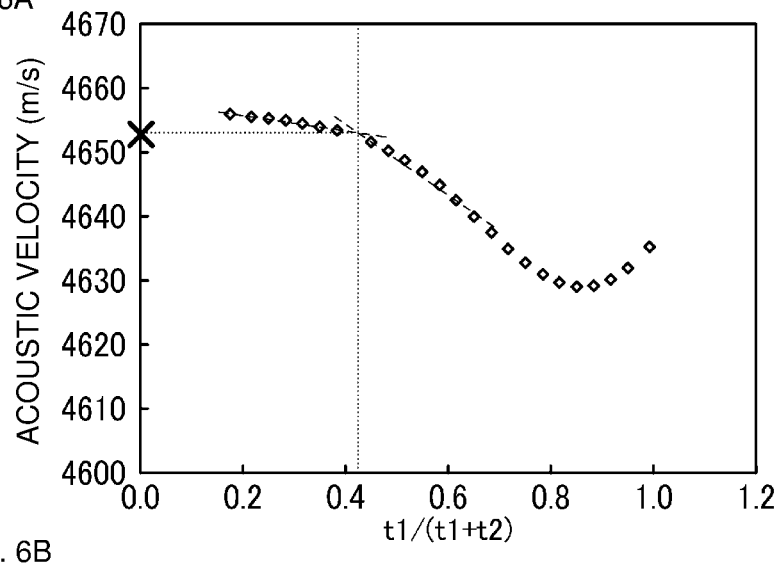
FIG. 6A is a graph illustrating, in the elastic wave device in which the total thickness of the entire silicon oxide film and a high-acoustic-velocity dielectric film is about 0.33λ, and a piezoelectric substrate has Euler angles of (about 0°, about 38°, about 0°), the relationship between the acoustic velocity of Sezawa waves and the thickness ratio of a first silicon oxide film to the entire silicon oxide film.
Figure 6B:
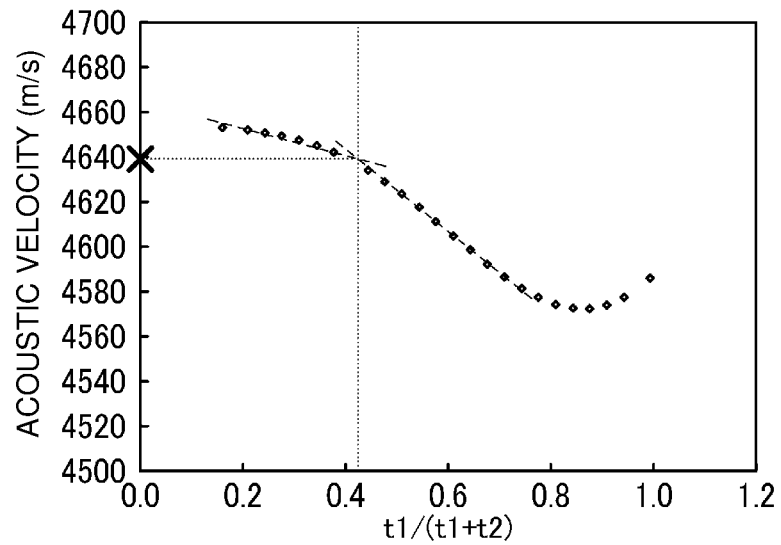
FIG. 6B is a graph illustrating, in the elastic wave device in which the total thickness of the entire silicon oxide film and a high-acoustic-velocity dielectric film is about 0.36λ, and a piezoelectric substrate has Euler angles of (about 0°, about 38°, about 0°), the relationship between the acoustic velocity of Sezawa waves and the thickness ratio of a first silicon oxide film to the entire silicon oxide film.
Figure 6C:
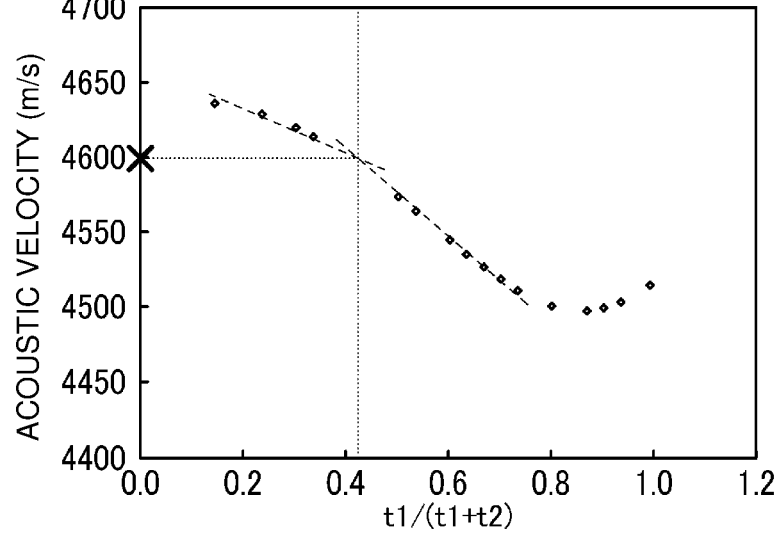
FIG. 6C is a graph illustrating, in the elastic wave device in which the total thickness of the entire silicon oxide film and a high-acoustic-velocity dielectric film is about 0.39λ, and a piezoelectric substrate has Euler angles of (about 0°, about 38°, about 0°), the relation between the acoustic velocity of Sezawa waves and the thickness ratio of a first silicon oxide film to the entire silicon oxide film.
Figure 7A:
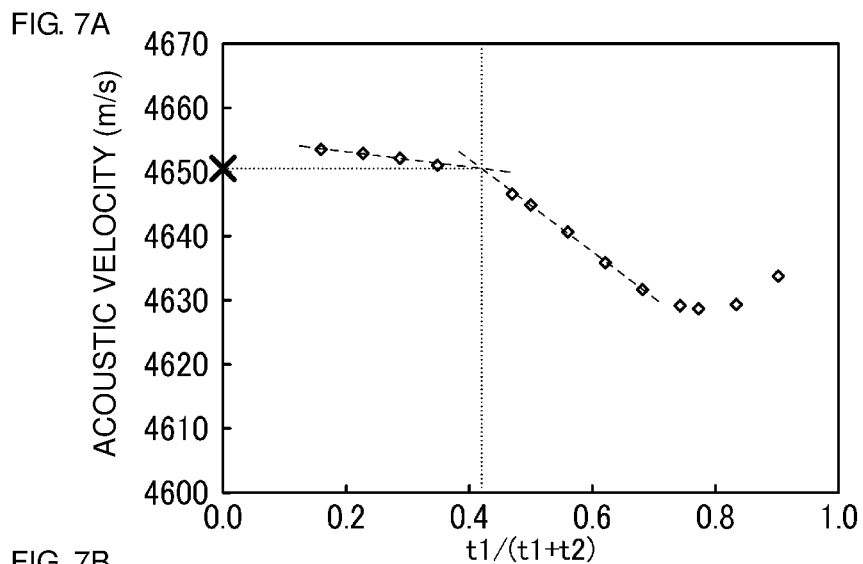
FIG. 7A is a graph illustrating, in the elastic wave device in which the total thickness of the entire silicon oxide film and a high-acoustic-velocity dielectric film is about 0.33λ, and a piezoelectric substrate has Euler angles of (about 0°, about 40°, about 0°), the relationship between the acoustic velocity of Sezawa waves and the thickness ratio of a first silicon oxide film to the entire silicon oxide film.
Figure 7B:
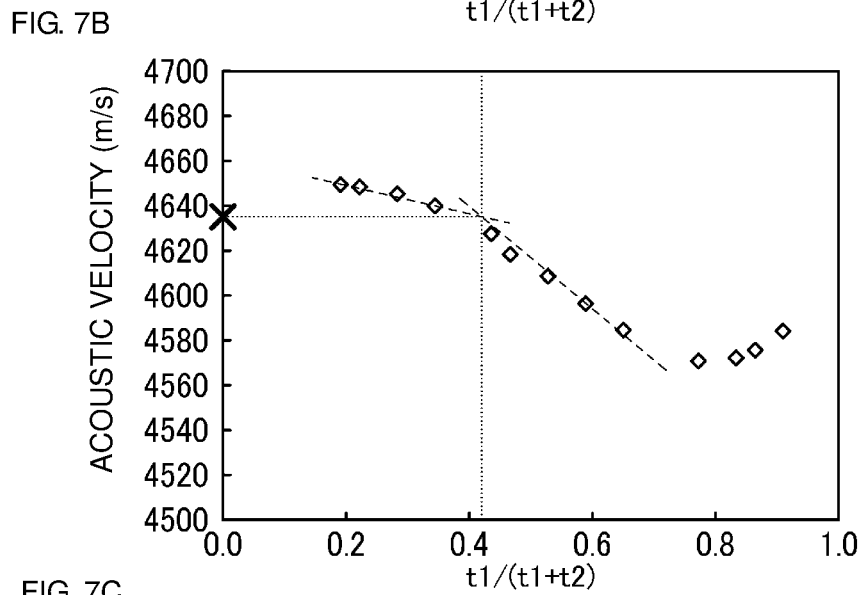
FIG. 7B is a graph illustrating, in the elastic wave device in which the total thickness of the entire silicon oxide film and a high-acoustic-velocity dielectric film is about 0.36λ, and a piezoelectric substrate has Euler angles of (about 0°, about 40°, about 0°), the relationship between the acoustic velocity of Sezawa waves and the thickness ratio of a first silicon oxide film to the entire silicon oxide film.
Figure 7C:
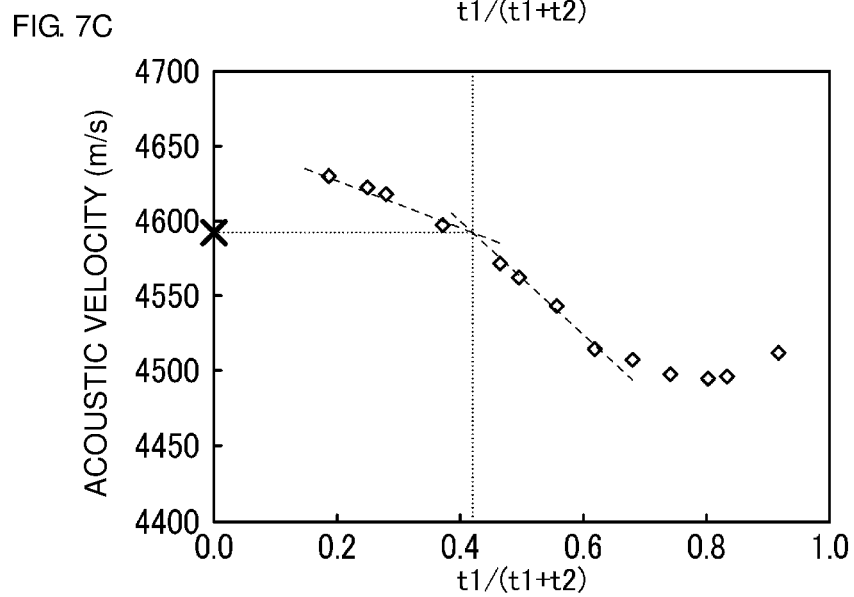
FIG. 7C is a graph illustrating, in the elastic wave device in which the total thickness of the entire silicon oxide film and a high-acoustic-velocity dielectric film is about 0.39λ, and a piezoelectric substrate has Euler angles of (about 0°, about 40°, about 0°), the relationship between the acoustic velocity of Sezawa waves and the thickness ratio of a first silicon oxide film to the entire silicon oxide film.

FIG. 5A to FIG. 7C are graphs each illustrating, in the elastic wave device 1 according to the present preferred embodiment, the relationship between the acoustic velocity of Sezawa waves and the ratio of the first silicon oxide film 4's thickness t1 to the silicon oxide film 7's thickness t3. In FIGS. 5A to 5C, the piezoelectric substrate 2 has a cut angle Γ of about 36°. In FIGS. 6A to 6C, the piezoelectric substrate 2 has a cut angle Γ of about 38°. In FIGS. 7A to 7C, the piezoelectric substrate 2 has a cut angle Γ of about 40°. In FIG. 5A, FIG. 6A, and FIG. 7A, the silicon oxide film 7's thickness t3 is about 0.30λ. In FIG. 5B, FIG. 6B, and FIG. 7B, the silicon oxide film 7's thickness t3 is about 0.33λ. In FIG. 5C, FIG. 6C, and FIG. 7C, the silicon oxide film 7's thickness t3 is about 0.36λ. In FIG. 5A to FIG. 7C, represents the acoustic velocity of Sezawa waves in a structure not including the high-acoustic-velocity dielectric film 5. The silicon oxide film 7's thickness t3 is, as in the present preferred embodiment, the sum of the first silicon oxide film 4's thickness t1 and the second silicon oxide film 6's thickness t2.

FIG. 5A to FIG. 7C demonstrate the following. When the ratio of the first silicon oxide film 4's thickness t1 to the silicon oxide film 7's thickness t3 is about 0.42 or less, the acoustic velocity of Sezawa waves is higher than that ("x" in the graphs) in the structure not including the high-acoustic-velocity dielectric film 5. When the ratio of the first silicon oxide film 4's thickness t1 to the silicon oxide film 7's thickness t3 is more than about 0.42, the acoustic velocity of Sezawa waves is lower than that in the structure not including the high-acoustic-velocity dielectric film 5.

In the elastic wave device 1 according to the present preferred embodiment, the first silicon oxide film 4's thickness t1 and the second silicon oxide film 6's thickness t2 are set such that the ratio of the first silicon oxide film 4's thickness t1 to the silicon oxide film 7's thickness t3 is about 0.42 or less, to thus achieve a decrease in the intensity of Sezawa waves, which are spurious waves for Rayleigh waves.

As described above, the cut angle Γ of the piezoelectric substrate 2 is not limited to about 38°, and may preferably be, for example, about 36° or about 40°. In other words, as long as the cut angle Γ of the piezoelectric substrate 2 is about 36° or more and about 40° or less, for example, Rayleigh waves are able to be used as the main mode.

As described above, in the elastic wave device 1 according to the present preferred embodiment, the high-acoustic-velocity dielectric film 5 is disposed in a region extending, to the piezoelectric substrate 2, from the position of a distance of about 0.42×the silicon oxide film 7's thickness t3 (the sum of the first silicon oxide film 4's thickness t1 and the second silicon oxide film 6's thickness t2) from the first main surface 21 of the piezoelectric substrate 2. This enables, compared with a structure not including the high-acoustic-velocity dielectric film 5, an increase in the acoustic velocity of Sezawa waves propagating through the above-described region, to thus achieve a decrease in the intensity of Sezawa waves. In other words, the elastic wave device 1 according to the present preferred embodiment achieves a decrease in the intensity (size) of Sezawa waves, which are spurious waves for Rayleigh waves.

As described above, in the elastic wave device 1 according to the present preferred embodiment, the high-acoustic-velocity dielectric film 5 is physically separated from the IDT electrode 3 with the first silicon oxide film 4 therebetween. This reduces or prevents degradation of the electric power handling capability of electrode fingers (the first electrode fingers 33 and the second electrode fingers 34) of the IDT electrode 3 due to contact of the high-acoustic-velocity dielectric film 5 with the electrode fingers.

The above-described preferred embodiment is merely one of various preferred embodiments according to the present invention. The above-described preferred embodiment may be modified in various ways in accordance with, for example, a design as long as it achieves the advantageous effects of the present invention. Hereinafter, several modifications of a preferred embodiment of the present invention will be described. The modifications described below may be appropriately combined.

An elastic wave device 1A according to a Modification 1 of a preferred embodiment of the present invention will be described with reference to FIG. 8.

Figure 8:
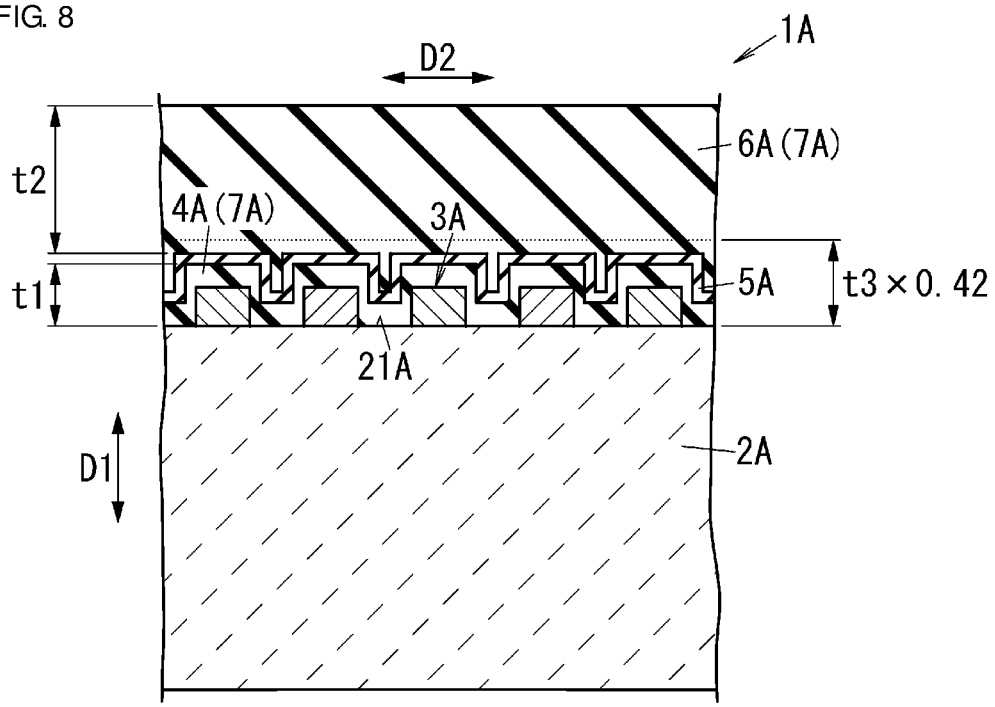
FIG. 8 is a sectional view of an elastic wave device according to a Modification 1 of a preferred embodiment of the present invention.

As illustrated in FIG. 8, the elastic wave device 1A according to the Modification 1 includes a piezoelectric substrate 2A, an IDT electrode 3A, a first silicon oxide film 4A, a high-acoustic-velocity dielectric film 5A, and a second silicon oxide film 6A. Incidentally, the piezoelectric substrate 2A, the IDT electrode 3A, the first silicon oxide film 4A, and the second silicon oxide film 6A are the same or substantially the same as the piezoelectric substrate 2, the IDT electrode 3, the first silicon oxide film 4, and the second silicon oxide film 6 of the elastic wave device 1 according to the above-described preferred embodiment, and detailed descriptions thereof will be omitted.

As illustrated in FIG. 8, the high-acoustic-velocity dielectric film 5A conforms to the IDT electrode 3A when viewed in the longitudinal direction (direction perpendicular or substantially perpendicular to the plane of the drawing) of the electrode fingers of the IDT electrode 3A (the first electrode fingers 33 and the second electrode fingers 34). Specifically, the high-acoustic-velocity dielectric film 5A has a protrusion-recess shape in the thickness direction (first direction) D1 of the piezoelectric substrate 2A. More specifically, the shape of the high-acoustic-velocity dielectric film 5A includes, in the thickness direction D1 of the piezoelectric substrate 2A, portions corresponding to the electrode fingers of the IDT electrode 3A and protruding away from the piezoelectric substrate 2A, and other portions corresponding to regions between electrode fingers of the IDT electrode 3A and protruding toward the piezoelectric substrate 2A. Also in this case, the high-acoustic-velocity dielectric film 5A is physically separated from the IDT electrode 3A with the first silicon oxide film 4A therebetween, so that the high-acoustic-velocity dielectric film 5A is not in contact with the IDT electrode 3A (refer to FIG. 8).

Also in this configuration, the high-acoustic-velocity dielectric film 5A is disposed in a region extending, to the piezoelectric substrate 2A, from a position of a distance of a silicon oxide film 7A's thickness of about t3×0.42 from a first main surface 21A of the piezoelectric substrate 2A, to thus achieve a decrease in the intensity of Sezawa waves propagating through the above-described region. In other words, the elastic wave device 1A according to the Modification 1 achieves a decrease in the intensity of Sezawa waves, which are spurious waves for Rayleigh waves. Incidentally, as in the present preferred embodiment, the silicon oxide film 7A's thickness t3 is the sum of the first silicon oxide film 4A's thickness t1 and the second silicon oxide film 6A's thickness t2.

An elastic wave device 1B according to a Modification 2 of a preferred embodiment of the present invention will be described with reference to FIG. 9.

Figure 9:
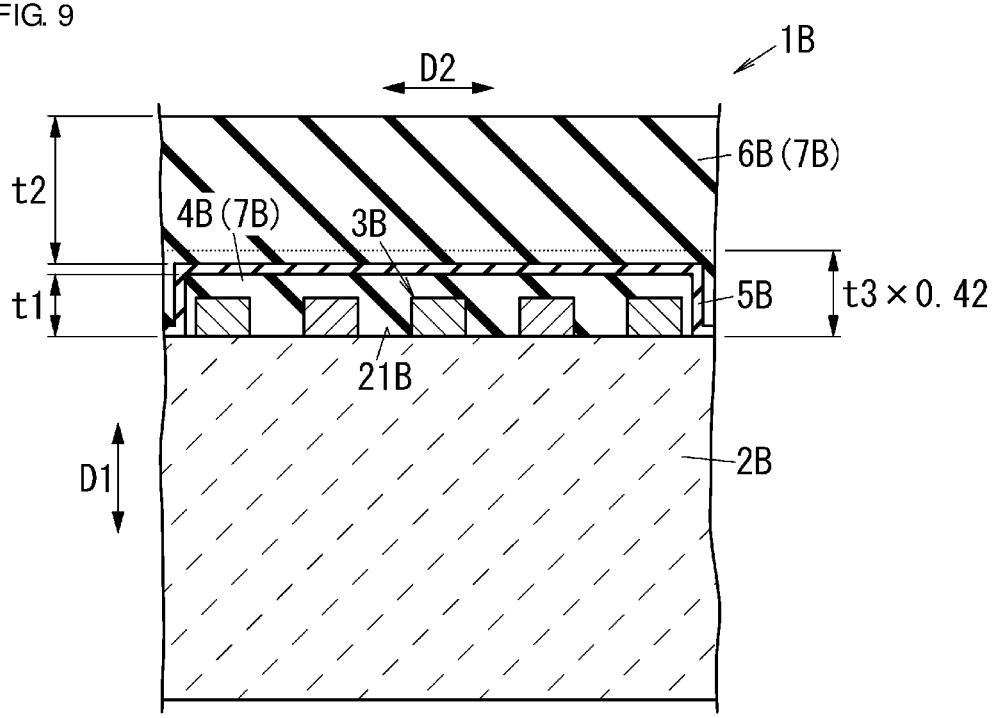
FIG. 9 is a sectional view of an elastic wave device according to a Modification 2 of a preferred embodiment of the present invention.

As illustrated in FIG. 9, the elastic wave device 1B according to the Modification 2 includes a piezoelectric substrate 2B, an IDT electrode 3B, a first silicon oxide film 4B, a high-acoustic-velocity dielectric film 5B, and a second silicon oxide film 6B. Incidentally, the piezoelectric substrate 2B, the IDT electrode 3B, the first silicon oxide film 4B, and the second silicon oxide film 6B are the same or substantially the same as the piezoelectric substrate 2, the IDT electrode 3, the first silicon oxide film 4, and the second silicon oxide film 6 of the elastic wave device 1 according to the above-described preferred embodiment, and detailed descriptions thereof will be omitted.

As illustrated in FIG. 9, the high-acoustic-velocity dielectric film 5B is provided on the piezoelectric substrate 2B so as to cover the first silicon oxide film 4B. Specifically, the high-acoustic-velocity dielectric film 5B includes an inner portion corresponding to the plurality of electrode fingers of the IDT electrode 3B and protruding away from the piezoelectric substrate 2B, and outer portions surrounding the plurality of electrode fingers and being in contact with the piezoelectric substrate 2B. Also in this case, the high-acoustic-velocity dielectric film 5B is physically separated from the IDT electrode 3B with the first silicon oxide film 4B therebetween, so that the high-acoustic-velocity dielectric film 5B is not in contact with the IDT electrode 3B (refer to FIG. 9).

Also in this configuration, the high-acoustic-velocity dielectric film 5B is disposed in a region extending, to the piezoelectric substrate 2B, from the position of the distance of a silicon oxide film 7B's thickness of about t3×0.42 from a first main surface 21B of the piezoelectric substrate 2B, to thus achieve a decrease in the intensity of Sezawa waves propagating through the above-described region. In other words, the elastic wave device 1B according to the Modification 2 achieves a decrease in the intensity of Sezawa waves, which are spurious waves for Rayleigh waves. Incidentally, as in the above-described preferred embodiment, the silicon oxide film 7B's thickness t3 is the sum of the first silicon oxide film 4B's thickness t1 and the second silicon oxide film 6B's thickness t2.

Hereinafter, modifications other than the above-described preferred embodiments and the Modifications 1 and 2 will be described.

The above-described preferred embodiments and the Modifications 1 and 2 have been described with examples in which the high-acoustic-velocity dielectric films 5, 5A, and 5B are dielectric films including silicon nitride. Alternatively, the high-acoustic-velocity dielectric films 5, 5A, and 5B may be dielectric films including at least one material selected from silicon nitride, aluminum nitride (AlN), aluminum oxide ($Al_2O_3$), silicon carbide (SiC), and diamond-like carbon (DLC), for example.

The above-described preferred embodiments and the Modifications 1 and 2 have been described with examples in which the high-acoustic-velocity dielectric films 5, 5A, and 5B have a thickness of about 0.03λ. When the thickness of the high-acoustic-velocity dielectric films 5, 5A, and 5B is less than about 0.005λ, the high-acoustic-velocity dielectric films 5, 5A, and 5B do not contribute to an increase in the acoustic velocity of Sezawa waves, which are spurious waves for Rayleigh waves, so that a decrease in the intensity of Sezawa waves is not achieved. When the high-acoustic-velocity dielectric films 5, 5A, and 5B have a thickness of about 0.05λ or more, the high-acoustic-velocity dielectric films 5, 5A, and 5B have increased stress. For this reason, the high-acoustic-velocity dielectric films 5, 5A, and 5B preferably have a thickness of about 0.005λ or more and less than about 0.05λ.

In addition to the silicon oxide film, another film may be provided on each of the second silicon oxide films 6, 6A, and 6B.

The above-described preferred embodiments and the modifications disclose the following aspects.

An elastic wave device (1; 1A; 1B) according to a preferred embodiment of the present invention uses Rayleigh waves as the main mode. The elastic wave device (1; 1A; 1B) includes a piezoelectric substrate (2; 2A; 2B), an IDT electrode (3; 3A; 3B), a first silicon oxide film (4; 4A; 4B), a high-acoustic-velocity dielectric film (5; 5A; 5B), and a second silicon oxide film (6; 6A; 6B). The piezoelectric substrate (2; 2A; 2B) includes a first main surface (21; 21A; 21B). The IDT electrode (3; 3A; 3B) is provided on the first main surface (21; 21A; 21B) of the piezoelectric substrate (2; 2A; 2B). The first silicon oxide film (4; 4A; 4B) is provided on the piezoelectric substrate (2; 2A; 2B) so as to cover the IDT electrode (3; 3A; 3B). The high-acoustic-velocity dielectric film (5; 5A; 5B) is provided on the first silicon oxide film (4; 4A; 4B) or the piezoelectric substrate (2; 2A; 2B) so as to cover the first silicon oxide film (4; 4A; 4B). The high-acoustic-velocity dielectric film (5; 5A; 5B) propagates longitudinal waves at an acoustic velocity higher than the acoustic velocity of longitudinal waves propagating through the first silicon oxide film (4; 4A; 4B). The second silicon oxide film (6; 6A; 6B) is provided on the high-acoustic-velocity dielectric film (5; 5A; 5B). The piezoelectric substrate (2; 2A; 2B) is made of lithium niobate. The high-acoustic-velocity dielectric film (5; 5A; 5B) is separated from the IDT electrode (3; 3A; 3B). The high-acoustic-velocity dielectric film (5; 5A; 5B) is provided at a distance of about (t1+t2)×0.42 or less from the first main surface (21; 21A; 21B) in the thickness direction (D1) of the piezoelectric substrate (2; 2A; 2B), where t1 represents the thickness of the first silicon oxide film (4; 4A; 4B), and t2 represents the thickness of the second silicon oxide film (6; 6A; 6B).

The above-described preferred embodiment achieves a decrease in the intensity of Sezawa waves, which are spurious waves for Rayleigh waves, while reducing or preventing degradation of the electric power handling capability of the IDT electrode (3; 3A; 3B).

An elastic wave device (1; 1A; 1B) according to a preferred embodiment of the present invention uses Rayleigh waves as the main mode. The elastic wave device (1; 1A; 1B) includes a piezoelectric substrate (2; 2A; 2B), an IDT electrode (3; 3A; 3B), a first silicon oxide film (4; 4A; 4B), a high-acoustic-velocity dielectric film (5; 5A; 5B), and a second silicon oxide film (6; 6A; 6B). The piezoelectric substrate (2; 2A; 2B) includes a first main surface (21; 21A; 21B). The IDT electrode (3; 3A; 3B) is provided on the first main surface (21; 21A; 21B) of the piezoelectric substrate (2; 2A; 2B). The first silicon oxide film (4; 4A; 4B) is provided on the piezoelectric substrate (2; 2A; 2B) so as to cover the IDT electrode (3; 3A; 3B). The high-acoustic-velocity dielectric film (5; 5A; 5B) is provided on the first silicon oxide film (4; 4A; 4B) or the piezoelectric substrate (2; 2A; 2B) so as to cover the first silicon oxide film (4; 4A; 4B). The second silicon oxide film (6; 6A; 6B) is provided on the high-acoustic-velocity dielectric film (5; 5A; 5B). The piezoelectric substrate (2; 2A; 2B) is made of lithium niobate. The high-acoustic-velocity dielectric film (5; 5A; 5B) is separated from the IDT electrode (3; 3A; 3B). The high-acoustic-velocity dielectric film (5; 5A; 5B) is provided at a distance of about (t1+t2)×0.42 or less from the first main surface (21; 21A; 21B) in the thickness direction (D1) of the piezoelectric substrate (2; 2A; 2B), where t1 represents the thickness of the first silicon oxide film (4; 4A; 4B), and t2 represents the thickness of the second silicon oxide film (6; 6A; 6B). The high-acoustic-velocity dielectric film (5; 5A; 5B) includes at least one material selected from silicon nitride, aluminum nitride, aluminum oxide, silicon carbide, and diamond-like carbon.

The above-described preferred embodiment achieves a decrease in the intensity of Sezawa waves, which are spurious waves for Rayleigh waves, while reducing or preventing degradation of the electric power handling capability of the IDT electrode (3; 3A; 3B).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device using Rayleigh waves as a main mode, the elastic wave device comprising:
   a piezoelectric substrate including a main surface;
   an IDT electrode provided on the main surface of the piezoelectric substrate;
   a first silicon oxide film provided on the piezoelectric substrate so as to cover the IDT electrode;
   a high-acoustic-velocity dielectric film provided on the first silicon oxide film or the piezoelectric substrate so as to cover the first silicon oxide film, and that propagates longitudinal waves at an acoustic velocity higher than an acoustic velocity of longitudinal waves propagating through the first silicon oxide film; and
   a second silicon oxide film provided on the high-acoustic-velocity dielectric film; wherein
   the piezoelectric substrate is made of lithium niobate; and
   the high-acoustic-velocity dielectric film is separated from the IDT electrode, and is provided at a distance of about (t1+t2)×0.42 or less from the main surface of the piezoelectric substrate in a thickness direction of the piezoelectric substrate where t1 represents a thickness of the first silicon oxide film, and t2 represents a thickness of the second silicon oxide film.

2. The elastic wave device according to claim 1, wherein the piezoelectric substrate is made of a Γ° Y-cut X-propagation lithium niobate single crystal, where Γ° represents a cut angle of the piezoelectric substrate.

3. The elastic wave device according to claim 1, wherein the IDT electrode is made of at least one of Al, Cu, Pt, Au, Ag, Ti, Ni, Cr, Mo, W, or an alloy including any one of Al, Cu, Pt, Au, Ag, Ti, Ni, Cr, Mo, or W.

4. The elastic wave device according to claim 1, wherein the IDT electrode has a laminated structure including a Pt layer and an Al layer.

5. The elastic wave device according to claim 4, wherein a thickness of the Pt layer is about $0.02\lambda$, and a thickness of the aluminum layer is about $0.03\lambda$.

6. The elastic wave device according to claim 1, wherein the high-acoustic-velocity dielectric film includes silicon nitride.

7. The elastic wave device according to claim 1, wherein a thickness of the high-acoustic-velocity dielectric film is about $0.03\lambda$.

8. An elastic wave device using Rayleigh waves as a main mode, the elastic wave device comprising:
- a piezoelectric substrate including a main surface;
- an IDT electrode provided on the main surface of the piezoelectric substrate;
- a first silicon oxide film provided on the piezoelectric substrate so as to cover the IDT electrode;
- a high-acoustic-velocity dielectric film provided on the first silicon oxide film or the piezoelectric substrate so as to cover the first silicon oxide film; and
- a second silicon oxide film provided on the high-acoustic-velocity dielectric film; wherein
- the piezoelectric substrate is made of lithium niobate;
- the high-acoustic-velocity dielectric film is separated from the IDT electrode and is provided at a distance of about $(t1+t2)\times0.42$ or less from the main surface of the piezoelectric substrate in a thickness direction of the piezoelectric substrate where t1 represents a thickness of the first silicon oxide film, and t2 represents a thickness of the second silicon oxide film; and
- the high-acoustic-velocity dielectric film includes at least one material selected from silicon nitride, aluminum nitride, aluminum oxide, silicon carbide, and diamond-like carbon.

9. The elastic wave device according to claim 8, wherein the piezoelectric substrate is made of a Γ° Y-cut X-propagation lithium niobate single crystal, where Γ° represents a cut angle of the piezoelectric substrate.

10. The elastic wave device according to claim 8, wherein the IDT electrode is made of at least one of Al, Cu, Pt, Au, Ag, Ti, Ni, Cr, Mo, W, or an alloy including any one of Al, Cu, Pt, Au, Ag, Ti, Ni, Cr, Mo, or W.

11. The elastic wave device according to claim 8, wherein the IDT electrode has a laminated structure including a Pt layer and an Al layer.

12. The elastic wave device according to claim 11, wherein a thickness of the Pt layer is about $0.02\lambda$, and a thickness of the aluminum layer is about $0.03\lambda$.

13. The elastic wave device according to claim 8, wherein the high-acoustic-velocity dielectric film includes silicon nitride.

14. The elastic wave device according to claim 8, wherein a thickness of the high-acoustic-velocity dielectric film is about $0.03\lambda$.

* * * * *